United States Patent [19]

Earnshaw et al.

[11] Patent Number: 4,942,575
[45] Date of Patent: Jul. 17, 1990

[54] ERROR CONNECTION DEVICE FOR PARITY PROTECTED MEMORY SYSTEMS

[75] Inventors: William E. Earnshaw, N. Lauderdale; Jay Howell, Margate; Paul B. Ripy, N. Lauderdale, all of Fla.

[73] Assignee: Modular Computer Systems, Inc.

[21] Appl. No.: 207,874

[22] Filed: Jun. 17, 1988

[51] Int. Cl.$^5$ ............................................. G06F 11/14
[52] U.S. Cl. .................................. 371/10.1; 371/21.1; 365/200
[58] Field of Search .................. 371/10, 21, 38, 50, 371/49, 10.1, 10.2, 10.3, 21.1, 21.2, 21.3, 21.4, 21.6, 40.1, 40.4, 49.1, 50.1, 51.1; 365/200; 364/200, 900

[56] References Cited

U.S. PATENT DOCUMENTS

| | | | |
|---|---|---|---|
| 4,654,847 | 3/1987 | Dutton | 371/10 |
| 4,656,610 | 4/1987 | Yoshida | 371/10 |
| 4,688,219 | 8/1987 | Takemae | 371/10 |
| 4,752,914 | 6/1988 | Nakano | 371/10 |
| 4,807,191 | 2/1989 | Flannagan | 371/10 |

Primary Examiner—Michael R. Fleming
Attorney, Agent, or Firm—Spencer & Frank

[57] ABSTRACT

The use of a redundant memory subsystem, memory flow control, and a method of copying (srubbing) data from the location of one memory subsystem to the corresponding location in the other memory subsystem provides correction of soft errors in a parity protected memory system without degrading the performance of the memory system except when an error occurs. A copy of the correct data is also provided to the memory system when a location in either of the memory subsystems experiences a hard error.

7 Claims, 1 Drawing Sheet

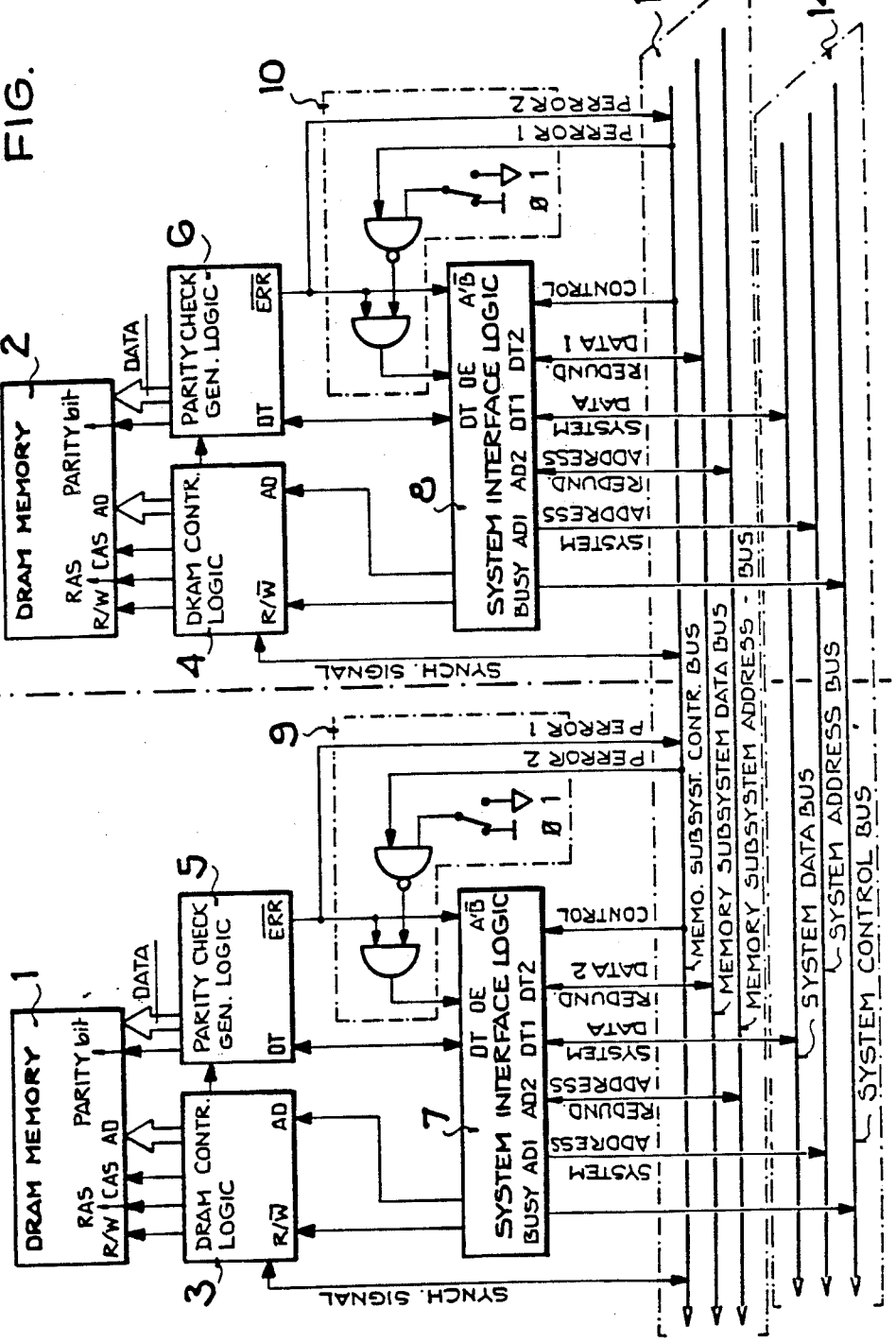

ERROR CONNECTION DEVICE FOR PARITY PROTECTED MEMORY SYSTEMS

BACKGROUND OF THE INVENTION

The present invention generally relates to computer memory systems using Dynamic Random Access Memory (DRAM) components, where data is stored in the memory components as individual bits of data which may have only one of two states, a logical one or a logical zero. These bits of data are typically moved in and out of the DRAM Components in groups. The groups of data are then handled by the memory system as a unit. The DRAM components are susceptible to two types of errors—hard errors and soft errors. A hard error is a permanent error and represents a memory location being stuck-at-1 or stuck-at-0. A soft error is temporary, random, and correctable since it is non-recurring and non-destructive. In typical DRAM memory systems some type of scheme for handling corrupted data from the memory component is used. The scheme may be a method of only detecting errors or it may be a method of detecting and correcting errors.

Typical memory systems which provide for error detection and correction do so using check bits which are generated from the group of data bits using a Hamming code. When the group of data is written to the DRAM Component both the data and its associated check bits are stored in the memory component. When a group of data is read from the DRAM component both the data and its associated check bits are retrieved from the DRAM component. The data and check bits are used to generate syndrome bits which not only indicate whether or not the data group has been corrupted but also provide enough information to correct the invalid data.

Typical memory systems which only check for corrupted data from the DRAM component do so using a parity check algorithm. The parity algorithm requires that a bit of data, referred to as a parity bit, be generated which indicates the number of logical ones within a particular group of data bits being stored in the DRAM component. When the group of data is written to the DRAM component both the data and its associated parity bit are stored in the memory component. When a group of data is read from the DRAM component both the data and its associated parity bit are retrieved from the DRAM component. A second parity bit is generated, based on the group of data bits read from memory, and compared to the first parity bit. If the two parity bits match then no error is said to have occurred. If the two parity bits do not match then an error is said to have occurred.

Both schemes of handling corrupt data have advantages in different applications. The parity algorithm is an efficient method of error checking because only one parity bit is required per data group. However, the parity algorithm does not provide enough information to determine which data bit or bits are wrong. Hamming code schemes are most efficient when the number of data bits in the group for which the check bits have been generated is large. For example, a group of 8 data bits requires 5 check bits which is a 63% overhead while a group of 32 data bits required only 7 check bits which is a 13% overhead.

The problem with the Hamming code scheme is that in order to write a partial data group to memory and still maintain valid check bits for the whole data group, the complete data group must first be read from memory, combined with the partial data group, new check bits generated and the complete updated data group with its associated check bits written to the memory. This read-modify-write operation must occur every time a partial data group write is performed thus degrading the performance of the memory system.

SUMMARY OF INVENTION

In view of the above described difficulties with prior art memory systems it is the object of the present invention to provide an improved memory system which in a simple way allows correction of soft errors in a parity protected memory system without degrading the performance of the memory system except when an error occurs. In a accordance with the invention this object is met by providing a memory system with a device for error detection and correction using parity bits for error detection and which has two memory subsystems and allows only one subsystem to return error free data to the main system bus as long as at least one of the memory subsystems contains error free data. A copy of the correct data is also provided to the memory system when a location in either of the memory subsystems experiences a hard error and wherein a memory subsystem returns error free data to the main system bus in order that the data may be written to the memory subsystem with the error data in its corresponding memory location.

The invention will be more specifically described with relation to a preferred embodiment and there to attached drawings.

BRIEF DESCRIPTION OF THE DRAWING

FIG. 1 is a logical block diagram showing apparatus which allows soft error correction in Parity Protected Memory devices.

DESCRIPTION OF THE PREFERRED EMBODIMENT

In FIG. 1 an overall embodiment of the invention is shown in which a memory system consists of two identical subsystems. Each subsystem contains the memory control logic, the memory for the locations to be accessed, the memory for the parity bits for each location, the parity generation/check logic, the memory subsystem flow control logic, and the system interface logic. The memory subsystems share a memory subsystem bus 13, which provides access to the memory subsystems without affecting the main system bus 14. The memory subsystem bus 15 provides all of the necessary address, data, and control signals to perform memory operations independently of the main system bus 14.

Both memory subsystems operate synchronously to each other and perform write operations in the same manner.

A parity bit is generated and stored for the smallest group of data bits which may be written during a memory write operation. The data and its parity bit is stored for each entry written to a memory location. The entries written may be partial words or complete words. Because a parity bit is stored for each smallest group of data, there is no performance penalty for partial word write operations. As data is read from each location in memory its parity bit is also read and used to check for a parity error. An error signal is used to indicate whether or not a parity error had occurred. A logic-1 indicates no error and a logic-0 indicates an error has occurred.

The flow control logic for one subsystem, which is designated as the primary subsystem, uses the complement of a logic-0 and the other subsystem's parity error signal and with the primary's parity error signal as an output enable the primary's data. The parity error signal is used to multiplex between the main system bus and the memory subsystem bus. The flow control logic of each subsystem monitors the error signal to determine if an error had occurred. There are four separate situations which may arise from the two subsystems checking the error signals:

Neither subsystem incurred a parity error
The primary subsystem incurred a parity error
The secondary subsystem incurred a parity error
Both subsystems incurred a parity error If neither subsystem incurred a parity error, then the subsystem which had been designated as the primary subsystem, by forcing a logic-0 to be anded with PERROR of the other subsystem then inverted, would allow its system interface logic to put the data on the system memory bus. The subsystem which had been designated as the secondary subsystem, by forcing a logic-1 to be anded with PERROR of the other subsystem then inverted, would hold its copy of the data in the system interface logic and allow it to be overwritten on the next read operation.

If the primary subsystem incurred a parity error, the flow control logic would signal the secondary subsystem of the primary's error condition and not allow the primary subsystem's system interface logic to put the data on the system bus, thus allowing the corrupt data to be overwritten on the next read operation. If the second subsystem incurred no parity error, its flow control logic would put its copy of the data on the system bus, put the address of the location with the error as well as a copy of the data on the memory subsystem bus and initiate a write cycle to the primary system. The primary's system interface logic would continue to indicate its busy status to the system bus until the end of the write operation.

If the secondary subsystem incurred a parity error the flow control logic would signal the primary subsystem on the secondary's error condition and not allow the secondary subsystem's system interface logic to put the data on the system bus, thus allowing the corrupt data to be overwritten on the next read operation. If the primary subsystem incurred no parity error, its flow control logic would put its copy of the data on the system bus, put the address of the location with the error as well as a copy of the data on the memory subsystem bus and initiate a write cycle to the secondary system. The secondary's system interface logic would continue to indicate its busy status to the system bus until the end of the write operation.

If both the primary and the secondary memory subsystems incur a parity error then neither subsystem's flow control logic will put the data on the system memory bus. This is the only uncorrectable soft error condition.

As shown in FIG. 1, there are two memory subsystems I, II, each of which perform memory read and write operations. The two subsystems communicate with each other over a memory subsystem bus 13 which includes address, data, and control buses. The two subsystems communicate with the rest of the computer system over the system memory bus 14 which likewise includes address, data, and control buses.

The DRAM memory blocks 1 and 2 contain the memory for the data bits and the parity bits of both subsystems. The DRAM components may be industry standard parts as applied to typical DRAM memory systems.

The DRAM control logic blocks 3 and 4 contain the logic required to access the DRAM memory components for both read and write operations as well as provide the DRAM refresh as required. Blocks 3 and 4 share a control signal, SYNC, which forces them to perform refresh operations at the same time. The DRAM control components may be industry standard parts as applied to typical DRAM memory systems.

The parity check/generante logic blocks 5 and 6 contain the logic required to generate the parity bit during write operations and to check the data for errors on read operations. On read operations a signal, PERROR1 for subsystem I and PERROR2 for subsystem II, is used to indicate whether an error had occurred or not. A logic-1 indicates that no error had occurred. A logic-0 indicates that a error had occurred. The Parity logic components may be industry standard parts as applied to typical DRAM memory systems.

The flow control logic blocks 9 and 10 contain the logic required to determine which subsystem is allowed to put its data on the system memory bus. The flow control logic may be industry standard parts as applied to typical digital logic design.

The system interface logic blocks 7 and 8 contain the logic required for the memory subsystems to interface with each other and with the rest of the computer system. They provide a signal, BUSY, to the system memory bus indicating that the subsystem is busy and can not currently accept any memory operations. The BUSY signal is asserted during any normal memory operation and during any memory correction operation. The system interface logic components may be industry standard parts as applied to typical digital bus interface logic.

While the invention has been particullary described with reference to a preferred embodiment it will be understood by those skilled in the art that various changes in form and detail may be made without departing from the scope of the invention. The machine language instructions for causing the various read and write operations are dependent upon the specific multiprocessors employed. These instructions are obvious to those skilled in the art of writing microcode programs for microprocessors.

Furthermore it is will be obvious that various modifications and changes may be made without departing from the scope of the present invention.

What is claimed is:

1. A memory system with error detection and correction circuitry for returning error free data to a main system bus, comprising:
    two memory subsystems each for performing read and write operations; and
    error detection and correction means coupled between said two memory subsystems for allowing only one of said memory subsystems to return error free data to the main bus system as long as at least one of said two memory subsystems contains error free data.

2. A memory system as defined in claim 1, wherein said error detection and correction means includes communication means for communicating between said two memory subsystems to determine which subsystem is to return error free data to the main system bus.

3. A memory system as defined in claim 1, wherein said error detection and correction means permits no data to be returned to said main bus system when both memory subsystems experience an error during a given read operation.

4. A memory system as defined in claim 1, wherein said error detection and correction means includes flow control means for causing error free data returned to the main system bus from one memory subsystem to be written into a corresponding memory location of the other memory subsystem if said other memory subsystem is determined to contain erroneous data.

5. A memory system as defined in claim 1, wherein said two memory subsystems operate synchronously to each other.

6. A memory system as defined in claim 1, wherein said communication means communicates between said two memory subsystems without affecting the main system bus.

7. A memory system as defined in claim 1, wherein said error detection and correction means includes for each memory subsystem: parity check logic means connected to the memory subsystem and having an output for producing a logic true signal representing that no error has occurred in the memory subsystem and a logic false signal representing that an error has occured in the memory subsystem; a NOR-gate having first and second inputs and an output; and an AND-gate having first and second inputs, the first input of said AND-gate being connected to the output of said parity check logic means and the second input of said AND-gate being connected to the output of said NOR-gate, the first input of said NOR-gate being connected for receiving a logical true signal if the memory subsystem is allowed to put data on the system main bus and receiving a logical false signal if the memory subsystem is not allowed to put data on the system main bus, and the second input of said NOR-gate being connected for receiving the parity check logic signal from the parity check logic means associated with the other one of the memory subsystems.

* * * * *